(12) United States Patent
Oshiyama et al.

(10) Patent No.: US 8,217,479 B2
(45) Date of Patent: Jul. 10, 2012

(54) SOLID-STATE IMAGE PICKUP ELEMENT, METHOD OF MANUFACTURING THE SAME, AND IMAGE PICKUP APPARATUS INCLUDING THE SAME

(75) Inventors: Itaru Oshiyama, Kumamoto (JP); Susumu Hiyama, Kumamoto (JP)

(73) Assignee: Sony Corporation, Tokyo (JP)

( * ) Notice: Subject to any disclaimer, the term of this patent is extended or adjusted under 35 U.S.C. 154(b) by 220 days.

(21) Appl. No.: 12/691,560

(22) Filed: Jan. 21, 2010

(65) Prior Publication Data

US 2010/0224946 A1   Sep. 9, 2010

(30) Foreign Application Priority Data

Mar. 4, 2009   (JP) ................ P2009-051208

(51) Int. Cl.
*H01L 31/0232* (2006.01)
*H01L 21/30* (2006.01)
(52) U.S. Cl. ........ 257/431; 257/432; 257/436; 257/439; 257/461; 257/E31.127; 257/E21.211; 438/788
(58) Field of Classification Search .................. 257/431, 257/432, 436, 439, 461, E31.127, E21.211; 438/788
See application file for complete search history.

(56) References Cited

U.S. PATENT DOCUMENTS

| 2009/0035484 A1 | 2/2009 | Kobayashi et al. |
| 2009/0189235 A1* | 7/2009 | Ikeda et al. ............ 257/432 |
| 2010/0141816 A1* | 6/2010 | Maruyama et al. ......... 348/294 |
| 2010/0224946 A1* | 9/2010 | Oshiyama et al. ............ 257/432 |
| 2011/0058062 A1* | 3/2011 | Maruyama et al. ......... 348/222.1 |

FOREIGN PATENT DOCUMENTS

| JP | 2005-123280 | 5/2005 |
| JP | 2008-306154 | 12/2008 |
| JP | 2008-306154 A | 12/2008 |
| WO | WO-2006/073152 A1 | 7/2006 |

OTHER PUBLICATIONS

Japanese Office Action issued Mar. 1, 2011 for corresponding Japanese Application No. 2009-051208.

* cited by examiner

*Primary Examiner* — Victor A Mandala
(74) *Attorney, Agent, or Firm* — Rader Fishman & Grauer, PLLC

(57) ABSTRACT

An embodiment of the invention provides a solid-state image pickup element, including: a semiconductor layer having a photodiode, photoelectric conversion being carried out in the photodiode; a silicon oxide film formed on the semiconductor layer in a region having at least the photodiode by using plasma; and a film formed on the silicon oxide film and having negative fixed charges.

19 Claims, 7 Drawing Sheets

SOLID-STATE IMAGE PICKUP ELEMENT, METHOD OF MANUFACTURING THE SAME, AND IMAGE PICKUP APPARATUS INCLUDING THE SAME

The present application claims priority to Japanese Patent Application JP 2009-051208 filed with the Japanese Patent Office on Mar. 4, 2009, the entire content of which is hereby incorporated by reference.

BACKGROUND OF THE INVENTION

1. Field of the Invention

The present invention relates to a solid-state image pickup element, a method of manufacturing the same, and an image pickup apparatus including the same.

2. Description of the Related Art

It is known that in a CCD solid-state image pickup element and a CMOS solid-state image pickup element, crystal defects in a photodiode, and interface states in an interface between a light receiving portion formed on a silicon substrate, and an insulating layer formed on the light receiving portion cause a dark current.

FIG. 13A is a schematic cross sectional view explaining the case where an insulating layer is formed on a silicon layer having a photodiode formed therein. FIG. 13B is an energy diagram of the structure shown in FIG. 13A. As shown in FIGS. 13A and 13B, interface states each indicated by a mark x occur in an interface between a silicon layer 51 having a photodiode PD formed therein, and an insulating layer 52 formed on the silicon layer 51. These interface states become a generation source of a dark current, and electrons originating in the interface are caused to flow in the form of the dark current into the photodiode PD.

In order to cope with this situation, a so-called Hole Accumulation Diode (HAD) structure is adopted as a technique for controlling the generation of the dark current. This technique, for example, is described in Japanese Patent Laid-Open No. 2005-123280 (referred to as Patent Document 1 hereinafter).

FIG. 14A is a schematic cross sectional view explaining the case where an HAD structure is obtained by forming a $p^+$-type semiconductor region. FIG. 14B is an energy diagram of the HAD structure shown in FIG. 13A. Specifically, as shown in FIGS. 14A and 14B, a p-type impurity is introduced into the neighborhood of a surface of a silicon layer 51 to form a $p^+$-type semiconductor region, and the resulting $p^+$-type semiconductor region is made a positive charge accumulation region 53 for accumulating therein positive charges (holes).

The HAD structure is obtained in which the positive charge accumulation region 53 is formed in the interface of the silicon layer 51 in such a manner, whereby the photodiode PD is kept away from the interface, thereby making it possible to suppress the generation of the dark current with the interface states as the generation source.

In general, in forming the HAD structure, ions such as B ions or $BF_2$ ions are implanted into the silicon layer 51 at an anneal temperature, thereby forming the $p^+$-type semiconductor region becoming the positive charge accumulation region 53 in the neighborhood of the interface of the silicon layer 51.

Also, it is essential for an existing ion implantation process that for the purpose of realizing the proper diffusion and activation of the ions implanted, a high temperature is held for as long a time period as possible.

However, holding the high temperature for a long time period is not desirable from a viewpoint of sufficiently ensuring the characteristics or the like of the solid-state image pickup element.

FIG. 15A is a schematic cross sectional view explaining the case where an insulating layer having negative fixed charges is formed on a silicon layer having a photodiode formed therein. FIG. 15B is an energy diagram of the structure shown in FIG. 14A. As shown in FIGS. 15A and 15B, there is proposed a technique for forming an insulating layer 55 having negative fixed charges 54 on the silicon layer 51 having the photodiode PD formed therein. This technique, for example, is described in Japanese Patent Laid-Open No. 2008-306154 (referred to as Patent Document 2 hereinafter).

According to this technique, even when as shown in FIG. 15B, the ions are not implanted into the silicon layer 51 in a state in which a band is bent, the positive charge accumulation region 53 is formed in the neighborhood of the interface of the silicon layer 51, thereby making it possible to accumulate the positive charges (holes) in the positive charge accumulation region 53.

$HfO_2$, $ZrO_2$, $Al_2O_3$, $TiO_2$, $Ta_2O_5$ or the like, for example, is given as a material for the insulating layer 55 having such negative fixed charges 54.

SUMMARY OF THE INVENTION

With the technique described in Patent Document 2, in depositing the insulating layer 55 having the negative fixed charges 54, a first film deposited by utilizing either an atomic layer deposition (ALD) method or a metal organic chemical vapor deposition (MOCVD) method, and a second film deposited by utilizing a physical vapor deposition (PVD) method are laminated in order.

According to that technique, the generation of the interface states can be suppressed by utilizing the ALD method, and the productivity can be enhanced by utilizing the PVD method.

With the manufacturing method proposed in Patent Document 2, however, since the same oxides are laminated and formed by utilizing the different two kinds of depositing methods, the characteristics of the insulating layer 55 having the negative fixed charges 54 are restricted by the oxide used.

In addition, the material which is hardly deposited by utilizing the ALD method may not be used in the insulating layer 55 having the negative fixed charges 54. From this viewpoint as well, the characteristics of the insulating layer 55 having the negative fixed charges 54 are restricted.

The present invention has been made in order to solve the problems described above, and it is therefore desirable to provide a solid-state image pickup element in which generation of a dark current can be suppressed, and a restriction of characteristics of a layer having negative fixed charges can be relaxed, a method of manufacturing the same, and an image pickup apparatus including the same.

In order to attain the desire described above, according to an embodiment of the present invention, there is provided a solid-state image pickup element including: a semiconductor layer having a photodiode formed therein, photoelectric conversion being carried out in the photodiode; a silicon oxide film formed on the semiconductor layer in a region having at least the photodiode formed therein by using plasma; and a film formed on the silicon oxide film and having negative fixed charges.

According to another embodiment of the present invention, there is provided a method of manufacturing a solid-state image pickup element including the steps of: forming a photodiode in a semiconductor layer; forming a silicon oxide film on the semiconductor layer in a region having at least the photodiode formed therein by using plasma; and forming a film having negative fixed charges on the silicon oxide film.

According to still another embodiment of the present invention, there is provided an image pickup apparatus including: a condensing optical portion for condensing an incident light; a solid-state image pickup element having a semiconductor layer having a photodiode formed therein, photoelectric conversion being carried out in the photodiode, a silicon oxide film formed on the semiconductor layer in a region having at least the photodiode formed therein by using plasma, and a film formed on the silicon oxide film and having negative fixed charges, the solid-state image pickup element serving to receive the incident light condensed by the condensing optical portion, thereby carrying out photoelectric conversion for the incident light; and a signal processing portion for processing a signal obtained through the photoelectric conversion in the solid-state image pickup element.

With the structure of the solid-state image pickup element according to the embodiment of the present invention, the formation of the film having the negative fixed charges results in that a positive charge accumulation region is formed in the neighborhood of an interface (the neighborhood of a surface) of the semiconductor layer having the photodiode formed therein, thereby making it possible to accumulate the positive charges (holes) in the positive charge accumulation region. As a result, it is possible to suppress the generation of the dark current caused by the interface states.

In addition, since the silicon oxide film formed by using the plasma can also be given the negative fixed charges, the sufficient negative bias effect can be obtained in combination of the silicon oxide film and the film having the negative fixed charges and formed on the silicon oxide film.

Also, since the silicon oxide film has the negative fixed charges, the film having the negative fixed charges can be made close to the interface of the silicon layer as compared with the case where a silicon oxide film (such as a thermally-oxidized film) having no negative fixed charges is formed.

Moreover, since the silicon oxide film has the negative fixed charges and thus is made a base film for preventing the semiconductor layer from being damaged in forming the film having the negative fixed charges. As a result, unlike the case of the technique described in Patent Document 2, the same oxide materials do not have to be laminated by utilizing the different two film deposing methods, and thus the restrictions of the method of depositing the film having the negative fixed charges, and the material for the film having the negative fixed charges are relaxed.

With the constitution of the method of manufacturing a solid-state image pickup element according to the another embodiment of the present invention, the silicon oxide film having the negative fixed charges can be formed on the photodiode in the step of forming the silicon oxide film on the semiconductor layer in the region having at least photodiode formed therein by using the plasma.

In addition, the silicon oxide film and the film having the negative fixed charges compose the structure that the positive charges (holes) can be accumulated in the neighborhood of the interface (in the neighborhood of the surface) of the semiconductor layer having the photodiode formed therein in the step of forming the film having the negative fixed charges on the silicon oxide film. As a result, it is possible to suppress the generation of the dark current caused by the interface states in the interface of the semiconductor layer.

Also, since the silicon oxide film is formed as the base of the film having the negative fixed charges, the silicon oxide film can prevent the semiconductor layer from being damaged in forming the film having the negative fixed charges. As a result, unlike the case of the technique described in Patent Document 2, the same oxide materials do not have to be laminated by utilizing the different two film depositing methods, and thus the restrictions of the method of deposing the film having the negative fixed charges, and the material for the film having the negative fixed charges are relaxed.

With the configuration of the image pickup apparatus according to the still another embodiment of the present invention, since the solid-state image pickup element of the embodiment composes the image pickup apparatus of the still another embodiment, it is possible to suppress the generation of the dark current.

As set forth hereinabove, according to the image pickup element and the method of manufacturing the same of the present invention, it is possible to suppress the generation of the dark current caused by the interface states in accordance with the effect of the negative bias having the sufficient magnitude.

Therefore, it is possible to realize the solid-state image pickup element which has the high reliability, and which operates stably without generating the dark current.

In addition, since the silicon oxide film becoming the base of the film having the negative fixed charges has the negative fixed charges, the restrictions of the method of deposing the film having the negative fixed charges, and the material for the film having the negative fixed charges are relaxed. Thus, the restriction of the characteristics of the film having the negative fixed charges is also relaxed.

According to the image pickup apparatus of the present invention, since the generation of the dark current can be suppressed in the solid-state image pickup element, the signal obtained through the photoelectric conversion in the solid-state image pickup element is stabilized.

Therefore, it is possible to realize the highly reliable image pickup apparatus which stably operates and in which the satisfactory image quality is obtained.

DETAILED DESCRIPTION OF THE PREFERRED EMBODIMENTS

Figure 1:
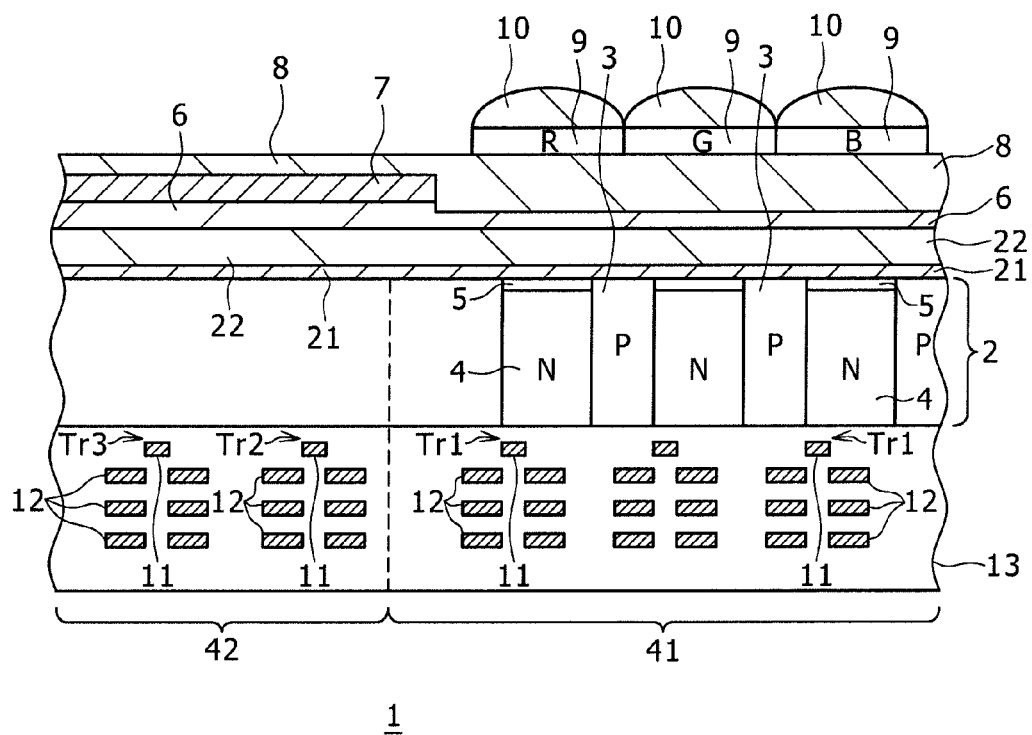
FIG. 1 is a schematic cross sectional view showing a structure of a solid-state image pickup element according to an embodiment of the present invention.

The preferred embodiments of the present invention will be described in detail hereinafter with reference to the accompanying drawings.

It is noted that the description will now be given in accordance with the following order.

1. Outline of the Present Invention
2. Solid-State Image Pickup Element
3. Method of Manufacturing Solid-State Image Pickup Element
4. Experiments (Measurements about Characteristics)
5. Image Pickup Apparatus <1. Outline of the Present Invention>

In the present invention, a silicon oxide film formed by using plasma is provided on a semiconductor layer in a region in which at least a photodiode is formed in a solid-state image pickup element including the semiconductor layer having the photodiode formed therein in which photoelectric conversion is carried out.

In addition, a film having negative fixed charges contained therein is provided on the silicon oxide film, thereby structuring the solid-state image pickup element.

"A silicon oxide film formed by using plasma" literally means a silicon oxide film deposited by using plasma.

Although various film depositing methods each using the plasma are expected as the method of depositing the silicon oxide film, preferably, a film depositing method is used with which the plasma is generated at a low temperature near a room temperature.

For example, the plasma is generated at the low temperature by using a Decoupled Plasma Source (DPS) system, thereby making it possible to deposit the silicon oxide film ($SiO_2$ film).

The silicon oxide film ($SiO_2$ film) is deposited by using the plasma, thereby making it possible to give the silicon oxide film ($SiO_2$ film) the negative fixed charges.

A material selected from the group including of a hafnium oxide ($HfO_2$), a zircon oxide ($ZrO_2$), an aluminum oxide ($Al_2O_3$), a titanium oxide ($TiO_2$), and a tantalum oxide ($Ta_2O_5$), for example, is given as the material for the film having the negative fixed charges contained therein. Since the film made of any of those oxides has been used in a gate insulating film or the like of an insulated gate field-effect transistor, the film depositing method thereof is established, and thus that film can be readily deposited.

When $HfO_2$ (refractive index: 2.05), $Ta_2O_5$ (refractive index: 2.16), $TiO_2$ (refractive index: 2.20) or the like, having a relatively high refractive index, of those materials is especially used, it is also possible to obtain an antireflection effect.

With regard to materials other than those materials described above, for example, oxides of rare earth elements are given. That is to say, there are given oxides of lanthanum, praseodymium, cerium, neodymium, promethium, samarium, europium, gadolinium, terbium, dysprosium, holmium, erbium, thulium, ytterbium, lutetium, and yttrium.

In addition, it is also possible to use any of a hafnium nitride, an aluminum nitride, a hafnium oxynitride, and an aluminum oxynitride.

Silicon (Si) or nitrogen (N) may be added to the film having the negative fixed charges contained therein unless an insulating property is impaired. A concentration of silicon or nitrogen added is suitably determined so as not to impair the insulating property of the film. Silicon or nitrogen is added to the film having the negative fixed charges contained therein in such a manner, thereby making it possible to enhance a heat resistance property of the film, and to enhance a capability of blocking ion implantation during the process.

The film having the negative fixed charges contained therein is preferably formed by utilizing any one of the atomic layer deposition (ALD) method, the metal organic chemical vapor deposition (MOCVD) method and the physical vapor deposition (PVD) method.

When the film is deposited by utilizing the ALD method, the deposition condition, for example, is set in such a way that a substrate temperature is in the range of 200 to 500° C., a flow rate of a precursor is in the range of 10 to 500 sccm, a radiation time period for the precursor is in the range of 1 to 15 seconds, and a flow rate of $O_3$ is in the range of 5 to 50 sccm.

When the film having the negative fixed charges contained therein is deposited by utilizing the MOCVD method, the deposition condition, for example, is set in such a way that the substrate temperature is in the range of 200 to 600° C.

Also, when the film having the negative fixed charges contained therein is deposited by utilizing the PVD method, the deposition condition, for example, is set in such a way that a pressure is in the range of 0.01 to 50 Pa, a D.C. power is in the range of 500 to 2,000 W, a flow rate of Ar is in the range of 5 to 50 sccm, and a flow rate of $O_2$ is in the range of 5 to 50 sccm.

For the purpose of obtaining an effect of suppression of tunneling of the electrons to a certain extent, preferably, a thickness of the silicon oxide film is set as 1 nm or more. More preferably, the thickness of the silicon oxide film is set as 3 nm or more so that the sufficient effect of suppression of the tunneling of the electrons is obtained.

The effect of suppression of the tunneling of the electrons is strengthened as the thickness of the silicon oxide film is increased. However, when the thickness of the silicon oxide film is made too thick, an effect of accumulation of the positive charges (holes) owing to the negative fixed charges is weakened. From this viewpoint, preferably, the thickness of the silicon oxide film is set as 30 nm or less.

In the present invention, since the film having the negative fixed charges contained therein is formed on the silicon oxide film formed by using the plasma, the silicon oxide film formed by using the plasma can also be given the negative fixed charges. As a result, the sufficient negative bias effect is obtained in combination of the silicon oxide film, and the film having the negative fixed charges contained therein formed on the silicon oxide film.

Also, since the silicon oxide film has the negative fixed charges, the film having the negative fixed charges contained therein can be made close to the interface of the semiconductor layer as compared with the case where a silicon oxide film (such as a thermally-oxidized film) having no negative fixed charge is formed.

Moreover, the silicon oxide film has the negative fixed charges contained therein and thus is made a base film for preventing the semiconductor layer from being damaged in forming the film having the negative fixed charges contained therein. As a result, the same oxide materials do not have to be laminated by utilizing the different two film depositing methods, and thus the restrictions of the method of depositing the film having the negative fixed charges contained therein, and the material for the film having the negative fixed charges contained therein are relaxed.

Therefore, according to an embodiment of the present invention, it is possible to suppress the generation of the dark current caused by the interface states in accordance with the effect of the negative bias having the sufficient magnitude. Therefore, it is possible to realize the solid-state image pickup element which has the high reliability, and which operates stably without generating the dark current. In addition, the restrictions of the method of depositing the film having the negative fixed charges contained therein, and the material for the film having the negative fixed charges contained therein are relaxed. Thus, the restriction of the characteristics of the film having the negative fixed charges contained therein is also relaxed.

Also, the image pickup apparatus of the present invention is configured so as to include the solid-state image pickup element of the present invention. As a result, since the generation of the dark current can be suppressed in the solid-state image pickup element, the signal obtained through the photoelectric conversion in the solid-state image pickup element is stabilized. Therefore, it is possible to realize the highly reliable image pickup apparatus which stably operates and in which the satisfactory image quality is obtained.

<2. Solid-State Image Pickup Element>

FIG. 1 is a schematic cross sectional view showing a structure of a solid-state image pickup element according to an embodiment of the present invention.

The embodiment of the present invention corresponds to the case the present invention is applied to a so-called back surface radiation type CMOS solid-state image pickup element (CMOS image sensor).

In the CMOS solid-state image pickup element 1, in a silicon substrate 2 in a photodiode portion 41, a charge accumulation region 4 becoming a photodiode is composed, as a light receiving portion for photoelectrically converting an incident light, of an N-type impurity region.

A positive charge accumulation region 5 is formed on each of surfaces of the charge accumulation regions 4 of the respective photodiodes.

Also, the charge accumulation region 4 and the positive charge accumulation region 5 compose the HAD structure previously stated.

In the photodiode portion 41, gate electrodes 11 of MOS transistors Tr1 are formed below the respective charge accumulation regions 4 of the silicon substrate 2, and wiring layers 12 made from metallic wirings are formed further below the respective charge accumulation region 4 of the silicon substrate 2. FIG. 1 shows the wiring layers 12 of three layers. An interface insulating layer 13 insulates between the gate electrode 11 and the uppermost wiring layer 12, between the uppermost wiring layer 12 and the middle wiring layer 12, and between the middle wiring layer 12 and the lowermost wiring layer 12.

It is noted the insulating layer 13 is supported by a supporting substrate (not shown) provided downward.

Pixels are respectively composed of the photodiodes having the respective charge accumulation regions 4.

Each of the pixels is structured so as to have one or more transistors including a transistor (a transfer transistor for reading out and transferring the charges accumulated in the corresponding one of the charge accumulation regions 4 in this case) Tr1.

Each adjacent two charge accumulation regions 4 of the pixels are isolated by a P-type isolation region 3.

It should be noted that although not illustrated, preferably, a $p^+$-type semiconductor region is formed in an interface, of the charge accumulation region 4, on the side of the gate electrode 11 of the transistor Tr1, thereby suppressing generation of a dark current in the interface between the charge accumulation region 4 and the insulating layer 13.

MOS transistors Tr2 and Tr3 each composed of either an N-channel MOS transistor or a P-channel MOS transistor are formed in a peripheral circuit portion 42.

Source and drain regions (not shown) of the MOS transistors Tr2 and Tr3, and a semiconductor well region (not shown) becoming channels of the MOS transistors Tr2 and Tr3 are formed in the silicon substrate 2.

A film 22 having negative fixed charges is formed in an upper layer relative to the silicon substrate 2 having the photodiodes formed therein. An oxide selected from the group including of $HfO_2$, $ZrO_2$, $Al_2O_3$, $TiO_2$, and $Ta_2O_5$, for example, is given as the material for the film 22 having the negative fixed charges contained therein. In addition, any of the nitrides, the oxynitrides, the oxides of the rare earth elements, and the like can also be used as the material for the film 22 having the negative fixed charges contained therein.

An electric field is applied to the surface of the charge accumulation region 4 owing to the presence of the negative fixed charges contained in the film 22 having the negative fixed charges, thereby forming a positive charge accumulation region (hole accumulation region) 5 in the surface of the charge accumulation region 4. As a result, the positive charge accumulation region 5 can be formed even when no ion is implanted into the surface of the charge accumulation region 4.

An insulating film 6, for example, made from a $SiO_2$ film is formed on the film 22 having the negative fixed charges contained therein.

A light blocking film 7 is formed on the insulating film 6 so as to cover a part of the photodiode portion 41, and the peripheral circuit portion 42.

A region in which a light is made incident to none of the photodiodes (optical block region (not shown)) is formed by the light blocking film 7, thereby making it possible to determine a black level in an image in accordance with outputs from the respective photodiodes.

In the peripheral circuit portion 42, a fluctuation of the characteristics of the MOS transistors Tr2 and Tr3, and the like caused by incidence of the light can be suppressed by the light blocking film 7.

A planarizing film 8 is formed so as to cover each of the $SiO_2$ film 6 and the light blocking film 7.

Color filters 9 having respective colors (red(R), green(G) and blue(B)) are formed every pixel on the planarizing film 8.

On-chip lenses 10 for light-condensing are provided on the color filters 9, respectively.

By adopting such a structure, with the CMOS solid-state image pickup element 1 of the embodiment, a light is made incident from an upper side of FIG. 1 to cause photoelectric conversion in each of the charge accumulation regions 4 of the respective photodiodes, thereby making it possible to receive and detect the incident light.

Also, the CMOS solid-state image pickup element 1 has a so-called back surface radiation type structure because the light is made incident to an upper layer on the side (back surface side) opposite to the side (front surface side) of the wiring layers 12 lying in the lower layer when viewed from the silicon substrate 2 having the photodiodes formed therein.

In addition, in the CMOS solid-state image pickup element 1 of the embodiment, in particular, a low-temperature plasma silicon oxide film ($SiO_2$ film) 21 formed by using low-temperature plasma is formed between each of the positive charge accumulation regions 5 on the surface of the silicon substrate 2, and the low-temperature plasma silicon oxide film ($SiO_2$ film) 21.

Figure 15A:
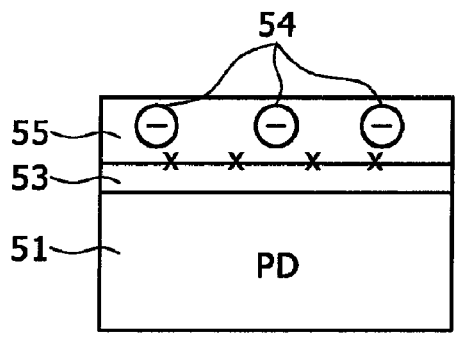
FIGS. 15A and 15B are respectively a schematic cross sectional view and an energy diagram each explaining the case where an insulating layer having negative fixed charges is formed on the silicon layer having a photodiode formed therein through the $p^+$-type semiconductor region.
Figure 15B:
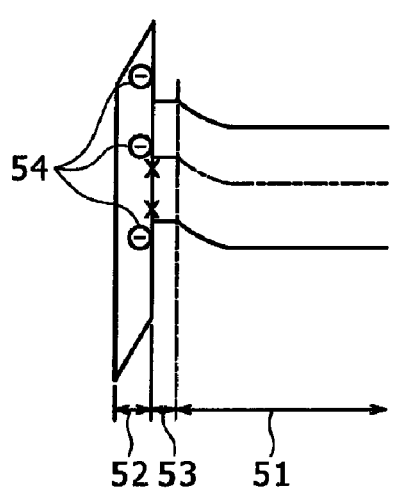

The provision of the film 22 having the negative fixed charges contained therein in the upper layer relative to the silicon substrate 2 results in that the band is bent similarly to the case of the related art shown in FIGS. 15A and 15B, thereby making it possible to accumulate the positive charges (holes) in the neighborhood of the interface of the silicon substrate 2.

It is noted that when $HfO_2$, $Ta_2O_5$, $TiO_2$ or the like, having a relatively high refractive index is especially formed as the film 22 having the negative fixed charges contained therein, it is also possible to obtain an antireflection effect.

Moreover, the low-temperature plasma silicon oxide film 21 is formed between each of the positive charge accumulation regions 5 on the surface of the silicon substrate 2, and the film 22 having the negative fixed charges contained therein, thereby making it possible to suppress the tunneling of the electrons trapped. In addition, the low-temperature plasma silicon oxide film 21 has the negative fixed charges because it is formed by using the plasma.

A method with which the plasma can be generated at the low temperature, for example, a method using the DPS system previously stated, or the like can be adopted as a method of depositing the low-temperature plasma silicon oxide film 21.

For the purpose of obtaining the effect of suppression of the tunneling of the electrons to a certain extent, preferably, a thickness of the low-temperature plasma silicon oxide film 21 is set as 1 nm or more. More specifically, the thickness of the low-temperature plasma silicon oxide film 21 is set as 3 nm or more so that the sufficient effect of suppression of the tunneling of the electrons is obtained.

The effect of suppression of the tunneling of the electrons is strengthened as the thickness of the silicon oxide film 21 is increased. However, when the thickness of the silicon oxide film 21 is made too thick, the effect of accumulation of the positive charges (holes) owing to the negative fixed charges is weakened. From this viewpoint, preferably, the thickness of the silicon oxide film 21 is set as 30 nm or less.

<3. Method of Manufacturing Solid-State Image Pickup Element>

Next, a method of manufacturing the CMOS solid-state image pickup element 1 according to another embodiment of the present invention will be described in detail with reference to FIGS. 2 to 9.

Figure 2:
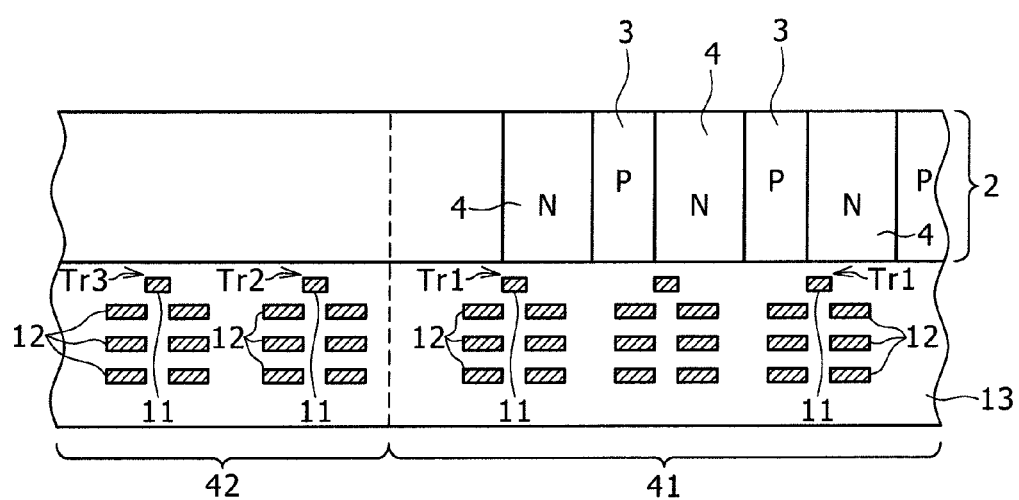
FIG. 2 is a schematic cross sectional view showing a process in a method of manufacturing the solid-state image pickup element shown in FIG. 1 according to another embodiment of the present invention.

The description will now be started with a state in which as shown in FIG. 2, the charge accumulation regions 4 are formed in the silicon substrate 2 in the photodiode portion 41, and the gate electrodes 11 of the respective MOS transistors Tr1, Tr2 and Tr3, and the wiring layers 12 are formed in the photodiode portion 41 and in the peripheral circuit portion 42.

Figure 3:
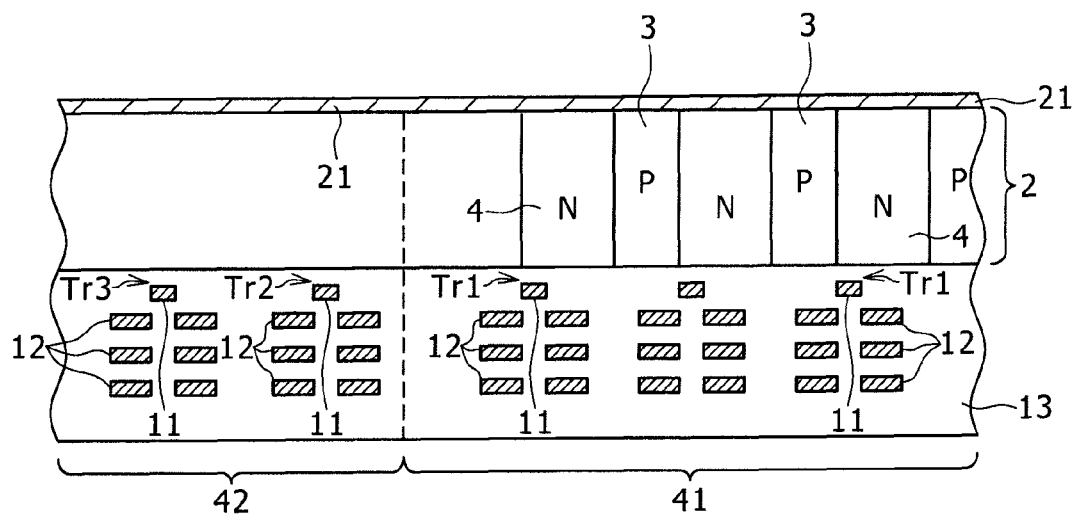
FIG. 3 is a schematic cross sectional view showing a process in a method of manufacturing the solid-state image pickup element shown in FIG. 1 according to the another embodiment of the present invention.

Firstly, as shown in FIG. 3, the low-temperature plasma silicon oxide film 21 is formed on the silicon substrate 2 having the charge accumulation regions 4 formed therein. Specifically, for example, the $SiO_2$ film is formed at the room temperature by carrying out the plasma processing.

Preferably, the thickness of the low-temperature plasma silicon oxide film 21 is set as 1 nm or more. More specifically, the thickness of the low-temperature plasma silicon oxide film 21 is set as 3 nm or more.

Figure 4:
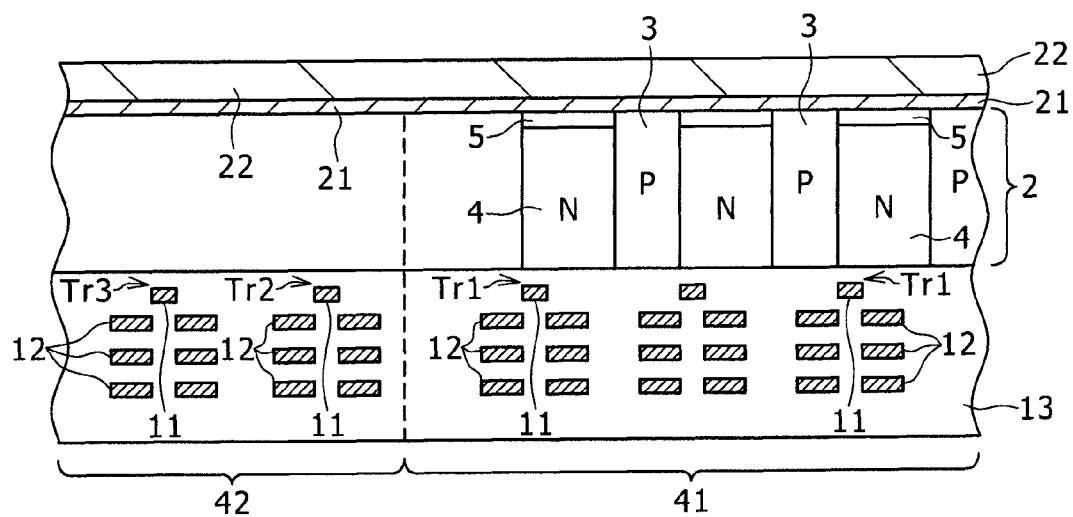
FIG. 4 is a schematic cross sectional view showing a process in a method of manufacturing the solid-state image pickup element shown in FIG. 1 according to the another embodiment of the present invention.

Next, as shown in FIG. 4, the film 22 having the negative fixed charges contained therein is formed on the low-temperature plasma silicon oxide film 21. An oxide selected from the group including of $HfO_2$, $ZrO_2$, $Al_2O_3$, $TiO_2$, and $Ta_2O_5$, for example, is given as the material for the film 22 having the negative fixed charges contained therein.

The ALD method, the MOCVD method or the PVD method, for example, is used as the method of depositing the film 22 having the negative fixed charges contained therein.

When the film 22 having the negative fixed charges contained therein is deposited by utilizing the ALD method, the deposition condition, for example, is set in such a way that the substrate temperature for the film deposition is in the range of 200 to 500° C., the flow rate of the precursor is in the range of 10 to 500 sccm, the radiation time period for the precursor is in the range of 1 to 15 seconds, and the flow rate of $O_3$ is in the range of 10 to 500 sccm.

Also, when the film 22 having the negative fixed charges contained therein is deposited by utilizing the PVD method, the deposition condition, for example, is set in such a way that the pressure is in the range of 0.01 to 50 Pa, the D.C. power is in the range of 500 to 2,000 W, the flow rate of Ar is in the range of 5 to 50 sccm, and the flow rate of $O_2$ is in the range of 5 to 50 sccm.

The film 22 having the negative fixed charges contained therein is formed on the low-temperature plasma silicon oxide film 21, thereby forming the positive charge accumulation region 5 on each of the surfaces of the charge accumulation regions 4.

Figure 5:
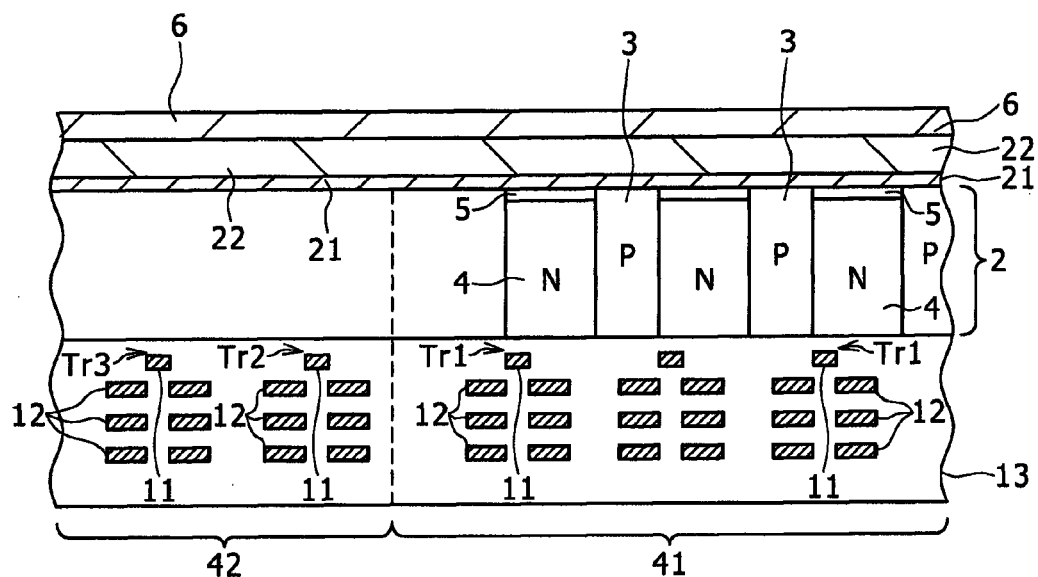
FIG. 5 is a schematic cross sectional view showing a process in a method of manufacturing the solid-state image pickup element shown in FIG. 1 according to the another embodiment of the present invention.

Next, as shown in FIG. 5, the insulating film 6 made from the $SiO_2$ film or the like is formed on the film 22 having the negative fixed charges contained therein.

Formation of the insulating film 6 results in that the surface of the film 22 having the negative fixed charges contained therein can be prevented from being directly exposed to the etching in the later etching for the light blocking film 7. In addition, it is possible to suppress a reaction between the film 22 having the negative fixed charges contained therein and the light blocking film 7 resulting from that the film 22 having the negative fixed charges contained therein and the light blocking film 7 are made to directly contact each other.

Figure 6:
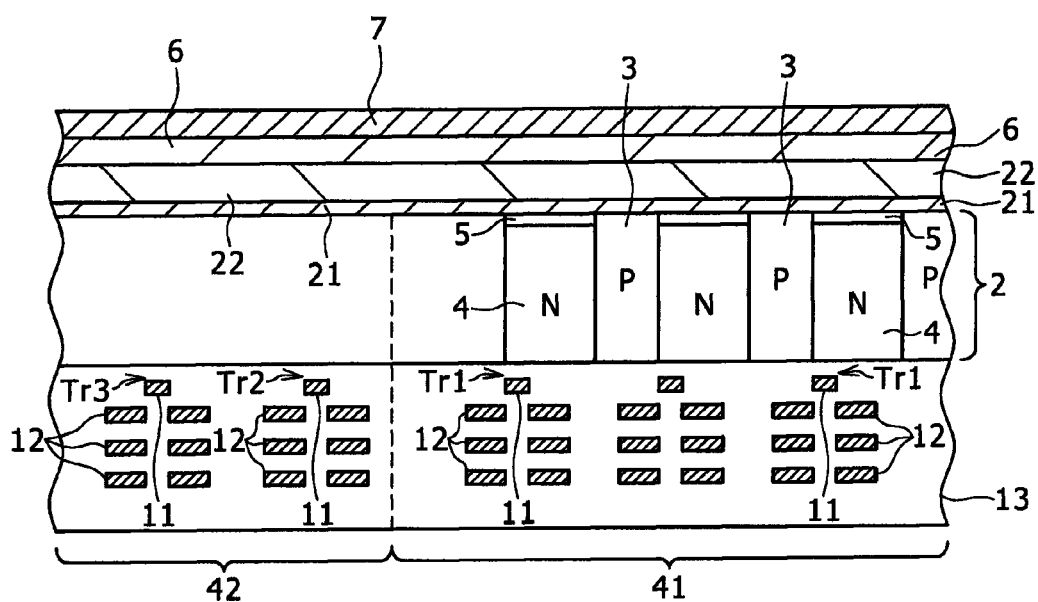
FIG. 6 is a schematic cross sectional view showing a process in a method of manufacturing the solid-state image pickup element shown in FIG. 1 according to the another embodiment of the present invention.

Next, as shown in FIG. 6, the metallic film becoming the light blocking film 7 is formed on the insulating film 6.

Figure 7:
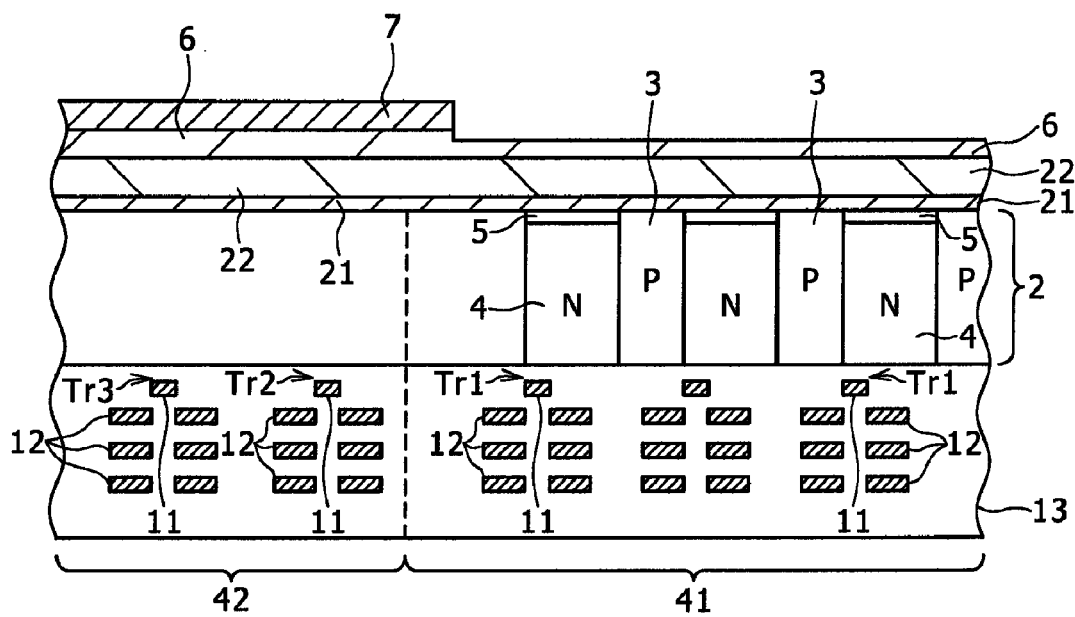
FIG. 7 is a schematic cross sectional view showing a process in a method of manufacturing the solid-state image pickup element shown in FIG. 1 according to the another embodiment of the present invention.

In addition, as shown in FIG. 7, the upper portions of the light blocking film 7 and the insulating film 6 are processed by carrying out the etching. As a result, the light blocking film 7 is left on the part of the photodiode portion 41, and the peripheral circuit portion 42.

Figure 8:
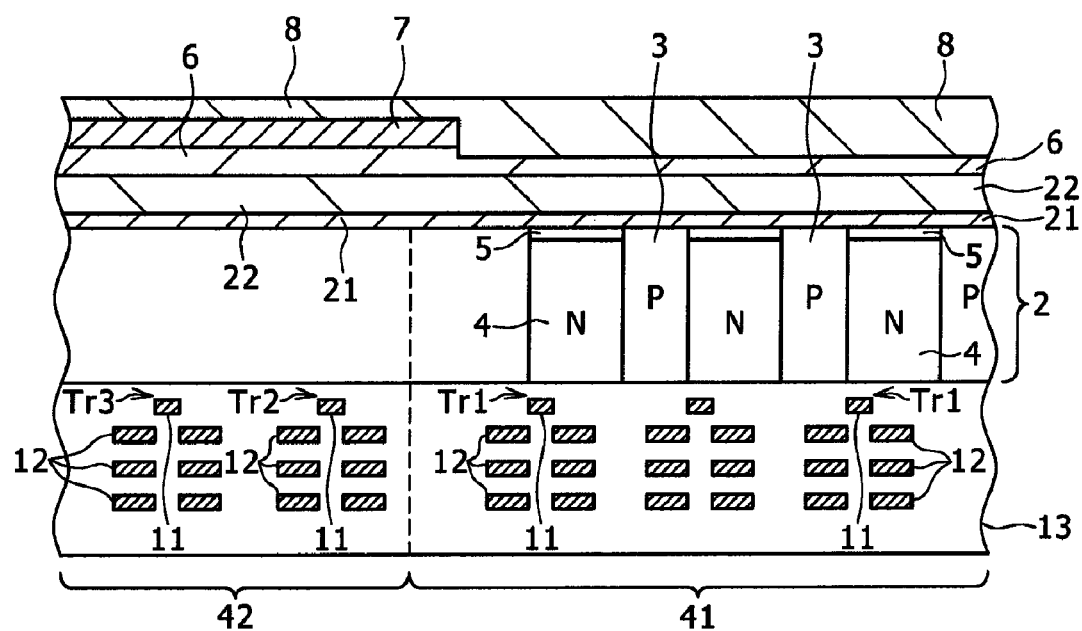
FIG. 8 is a schematic cross sectional view showing a process in a method of manufacturing the solid-state image pickup element shown in FIG. 1 according to the another embodiment of the present invention.

Next, as shown in FIG. 8, the planarizing film 8 is formed so as to cover the surface of the part of the photodiode portion 41, and the surface of the remaining light blocking film 7. The $SiO_2$ film, for example, is formed as the planarizing film 8 by utilizing the application method. The planarizing film 8 is formed so as to have a sufficient thickness, whereby the surface can be planarized by removing a stepped portion formed between the insulating film 6 and the remaining light blocking film 7.

Figure 9:
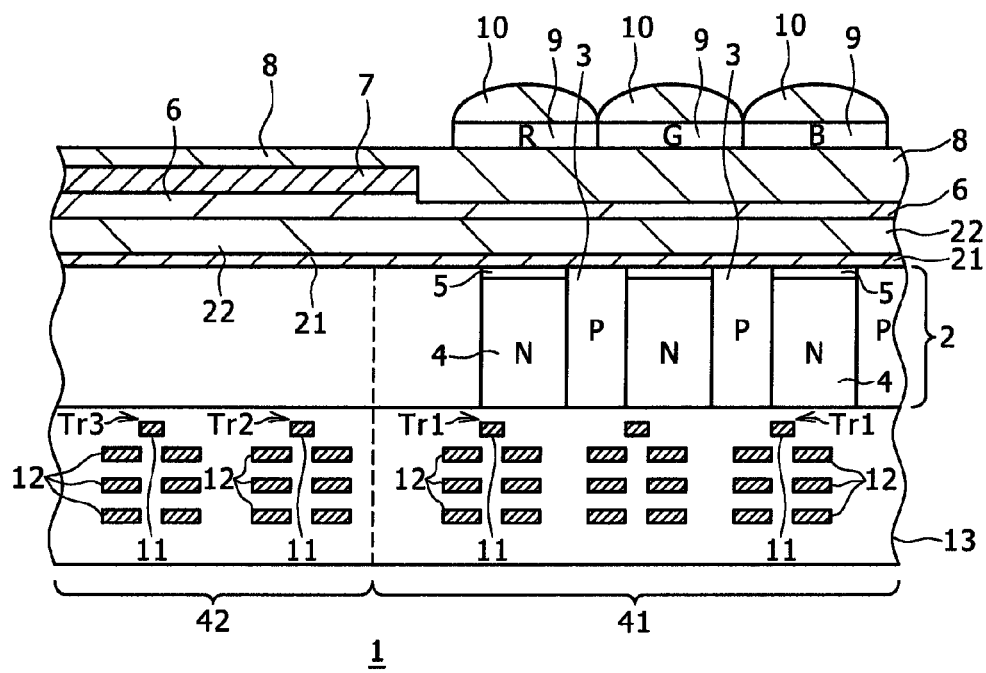
FIG. 9 is a schematic cross sectional view showing a process in a method of manufacturing the solid-state image pickup element shown in FIG. 1 according to the another embodiment of the present invention.

Finally, as shown in FIG. 9, in the photodiode portion 41, the color filters 9 and the on-chip lenses 10 are formed in this order above the photodiodes of the respective pixels.

It is noted that for the purpose of preventing the processing damage to the color filters 9 during the lens processing, a light transmissive insulating film (not shown) may be formed between the color filters 9 and the on-chip lenses 10.

In such a manner, the CMOS solid-state image pickup element 1 shown in FIG. 1 can be manufactured.

According to the structure of the CMOS solid-state image pickup element 1 shown in FIG. 1 of the embodiment, the film 22 having the negative fixed charges contained therein is formed on the silicon substrate 2, having the charge accumulation regions 4 formed therein, in the photodiode portion 41 through the low-temperature plasma silicon oxide film 21.

The low-temperature plasma silicon oxide film 21 has the negative fixed charges contained therein because it is formed by using the plasma. For this reason, the sufficient negative bias effect is obtained in combination of the two films of the silicon oxide film 21 and the film 22 having the negative fixed charges contained therein. Thus, the band can be bent similarly to the case of the related art shown in FIGS. 15A and 15B owing to the presence of the negative fixed charges contained in the silicon oxide film 21 and the film 22 having the negative fixed charges. As a result, each of the positive charge accumulation regions 5 is formed in the neighborhood of the interface of the silicon substrate 2 so that the positive charges (holes) are accumulated in each of the positive charge accumulation regions 5, thereby making it possible to suppress the generation of the dark current caused by the interface states.

In addition, since the low-temperature plasma silicon oxide film 21 is formed as the base of the film 22 having the negative fixed charges, the low-temperature plasma silicon oxide film 21 can prevent the silicon substrate 2 from being damaged in forming the film 22 having the negative fixed charges.

As a result, unlike the case of the related art described in Patent Document 2, the same oxide materials do not have to be laminated by utilizing the different two film deposing method, and thus the restrictions of the method of depositing the film 22 having the negative fixed charges contained therein, and the material for the film 22 are relaxed.

Therefore, according to the embodiment of the present invention, it is possible to suppress the generation of the dark current caused by the interface states in accordance with the effect of the negative bias having the sufficient magnitude. Therefore, it is possible to realize the solid-state image pickup element 1 which has the high reliability, and which operates stably without generating the dark current. In addition, the restrictions of the method of depositing the film 22 having the negative fixed charges contained therein, and the material for the film 22 are relaxed. Thus, the restriction of the characteristics of the film 22 having the negative fixed charges is also relaxed.

It should be noted that a charge accumulation region composing the photodiode can also be formed in a silicon epitaxial layer on a silicon substrate instead of forming the charge accumulation region 4 composing the photodiode in the silicon substrate 2 shown in FIG. 1.

In addition, it should be noted that the structure of the upper layers relative to the film 22 having the negative fixed charges contained therein, and the structure of the peripheral circuit portion 42 are by no means limited to those in the embodiment described above, and thus various changes thereof can be made.

For example, it is also possible to adopt the structure described as an embodiment in Patent Document 2.

Although the embodiment described above corresponds to the case where the present invention is applied to the CMOS solid-state image pickup element, the present invention can also be applied to a solid-state image pickup element having any other suitable structure.

For example, the present invention can also be applied to a CCD solid-state image pickup element. In this case, a silicon oxide film formed by using the plasma, and a film having negative fixed charges are formed in order on a light receiving portion, thereby making it possible to suppress the generation of the dark current caused by the interface states.

In addition, the embodiment described above corresponds to the case where the present invention is applied to the CMOS solid-state image pickup element having the back surface radiation type structure.

However, the present invention can also be applied to a solid-state image pickup element having a so-called surface radiation type structure in which wiring layers and transfer electrodes are formed on a side, of a semiconductor layer having photodiodes formed therein, to which a light is made incident.

<4. Experiments (Measurements about Characteristics)>

Here, the $HfO_2$ film was formed as the insulating film having the negative fixed charges on the $SiO_2$ film formed by carrying out the plasma processing similarly to the case of the CMOS solid-state image pickup element 1 shown in FIG. 1, and the characteristics of the resulting lamination structure were checked.

MOS capacitors in each of which an electrode layer was formed on a silicon substrate through an insulating layer were manufactured as Test Element Groups (TEGs) for measurements about the characteristics.

Also, the TEGs using the following lamination structures were manufactured as the insulating layers of the MOS capacitors.

(1) The $SiO_2$ film was formed so as to have a thickness of 2 nm by using the plasma, and the $HfO_2$ film was formed so as to have a thickness of 50 nm by utilizing the PVD method.

(2) The $SiO_2$ film was formed so as to have a thickness of 3 nm by using the plasma, and the $HfO_2$ film was formed on the $SiO_2$ film so as to have a thickness of 50 nm by utilizing the PVD method.

(3) One $HfO_2$ film was formed so as to have a thickness of 11 nm by utilizing the ALD method, and the other $HfO_2$ film was formed on the one $HfO_2$ film so as to have a thickness of 50 nm by utilizing the PVD method.

C-V measurements were carried out with respect to the TEGs thus manufactured.

Figure 10:
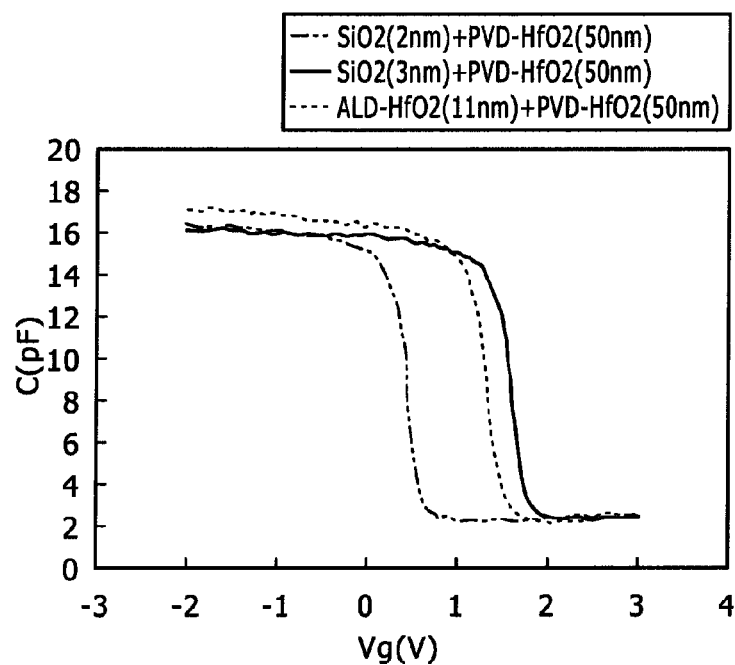
FIG. 10 is a graph showing a relationship between a gate voltage and a capacitance obtained through a C-V measurement about a Test Element Group (TEG)

FIG. 10 shows a relationship between a gate voltage $V_g$ (V) and a capacitance (pF) as the measurement results.

It is understood from the measurement results shown in FIG. 10 that the same degree or more of a relatively large flat band voltage is obtained in the case where the $SiO_2$ film was formed by using the plasma so as to have the thickness of 3 nm, and the $HfO_2$ film was formed on the $SiO_2$ film than in the case of the HfO$_2$ films formed in combination of utilization of the ALD method and the PVD method.

In addition, it is also understood that although the flat band voltage becomes smaller in the case where the thickness of the SiO$_2$ film formed by carrying out the plasma processing was 2 nm than in the case where the thickness of the SiO$_2$ film formed by carrying out the plasma processing was 3 nm, in the case where the thickness of the SiO$_2$ film formed by carrying out the plasma processing was 2 nm, the positive flat band voltage is obtained and the lamination structure has the negative fixed charges.

Figure 11:
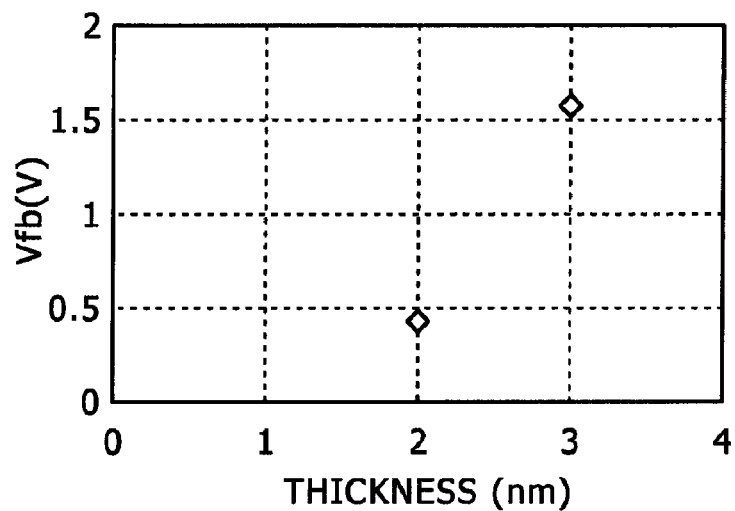
FIG. 11 is a graph showing a relationship between a thickness of a $SiO_2$ film formed by using plasma processing, and a flat band voltage of the $SiO_2$ film.

Next, FIG. 11 shows a relationship, between the thickness of the SiO$_2$ film formed by carrying out the plasma processing, and the flat band voltage V$_{fb}$, which are plotted based on the measurement results shown in FIG. 10.

As shown in FIG. 11, it is thought that a value of the flat band voltage V$_{fb}$ depends on the thickness of the SiO$_2$ film, and thus the flat band voltage V$_{fb}$ becomes large as the thickness of the SiO$_2$ film is larger.

It is noted that the HfO$_2$ film was formed on the SiO$_2$ film having the thickness of 8.5 nm and formed through thermal oxidation so as to have the thickness of 50 nm by utilizing the PVD method, thereby manufacturing a TEG as a comparative example. The C-V measurement was carried out with respect to this TEG as well, and as a result, although not illustrated, the flat band voltage did not become the positive voltage, and thus the negative fixed charges were not obtained.

Therefore, when the SiO$_2$ film is formed by using the plasma, the lamination structure in which the HfO$_2$ film is formed on the SiO$_2$ film has the negative fixed charges.

<5Image Pickup Apparatus>

Next, an image pickup apparatus according to still another embodiment of the present invention will be described in detail with reference to FIG. 12.

Figure 12:
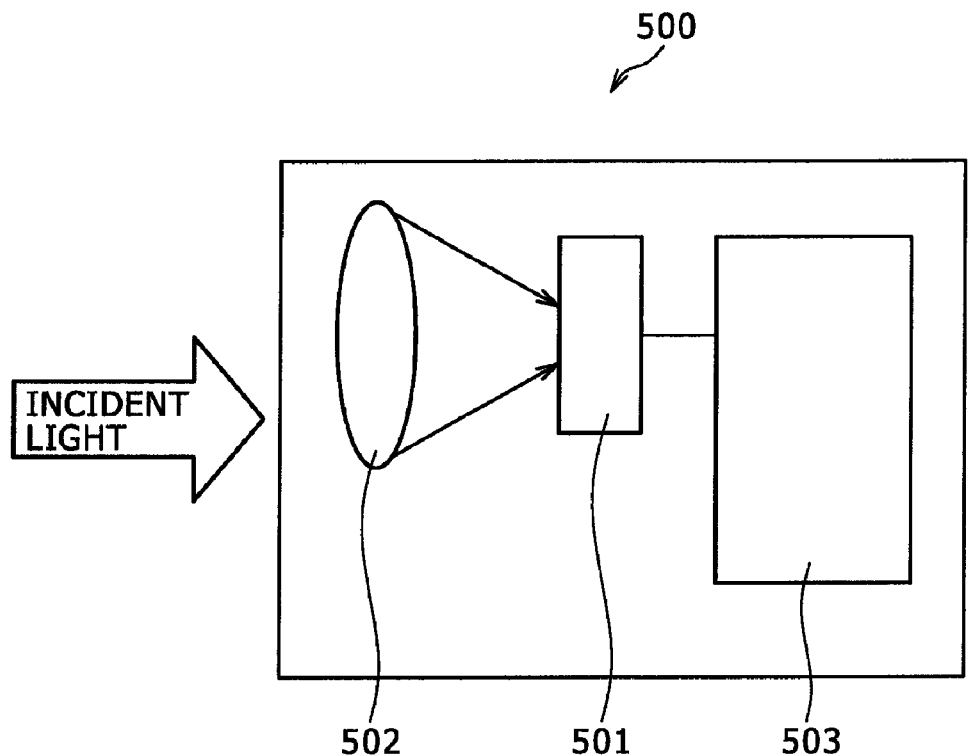
FIG. 12 is a schematic block diagram showing a configuration of an image pickup apparatus according to still another embodiment of the present invention.
Figure 13A:
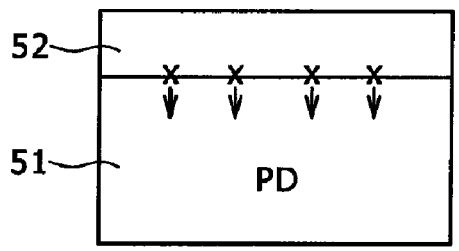
FIGS. 13A and 13B are respectively a schematic cross sectional view and an energy diagram each explaining the case where an insulating layer is formed on a silicon layer having a photodiode formed therein.
Figure 13B:
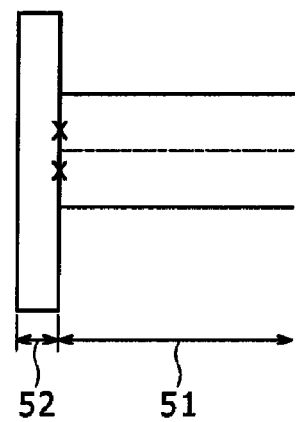
Figure 14A:
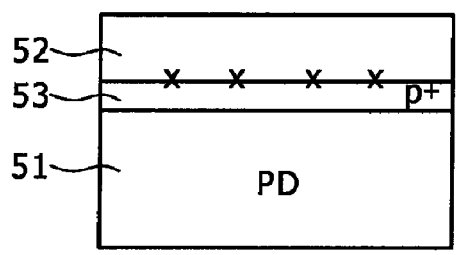
FIGS. 14A and 14B are respectively a schematic cross sectional view and an energy diagram each explaining the case where a $p^+$-type semiconductor region is formed on the silicon layer having the photodiode formed therein to obtain an HAD structure.
Figure 14B:
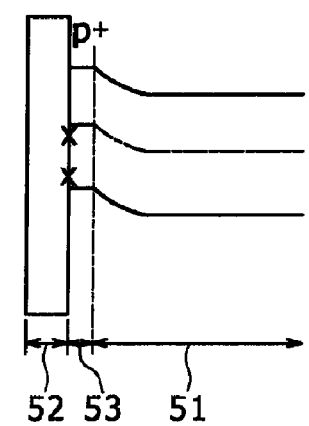

FIG. 12 is a schematic block diagram showing a configuration of the image pickup apparatus according to the still another embodiment of the present invention.

A video camera, a digital still camera, a camera of a mobile phone, or the like, for example, is given as the image pickup apparatus of the still another embodiment.

As shown in FIG. 12, the image pickup apparatus 500 has an image pickup portion 501 including a solid-state image pickup element (not shown). An imaging optical system 502 for condensing an incident light to image an image corresponding to the incident light is provided in a preceding stage of the image pickup portion 501. In addition, a signal processing portion 503 having a drive circuit for driving the image pickup portion 501, a signal processing circuit for processing a signal obtained through photoelectric conversion in the image pickup element into an image signal, and the like is connected to a subsequent stage of the image pickup portion 501. In addition, the image signal obtained through the processing executed in the signal processing portion 503 can be stored in an image storage portion (not shown).

In the image pickup apparatus 500 of the still another embodiment of the present invention, the CMOS solid-state image pickup element 1 of the embodiment previously described with reference to FIG. 1 is used as the solid-state image pickup element.

According to the image pickup apparatus 500 of the still another embodiment, there is an advantage that an image of high grade can be recorded because of use of the CMOS solid-state image pickup element 1 in which the generation of the dark current is suppressed in accordance with the sufficient negative bias effect.

It should be noted that the image pickup apparatus of the present invention is by no means limited to the configuration shown in FIG. 12, and thus the present invention can be applied to the image pickup apparatus as long as the image pickup apparatus uses the image pickup element of the present invention.

For example, the image pickup element may have a form which is formed as one chip or may also have a module-like form which has an image pickup function, and into which the image pickup portion, and the signal processing portion or the optical system are collectively packaged.

The image pickup apparatus of the present invention, for example, can be applied to various kinds of image pickup apparatuses such as a camera and a mobile apparatus having an image pickup function. In addition, the wording "the image pickup apparatus" includes a fingerprint detecting apparatus or the like as well in the wide sense.

The present invention is by no means limited to the embodiments described above, and thus various constitutions may also be adopted without departing from the gist of the present invention.

The present application contains subject matter related to that disclosed in Japanese Priority Patent Application JP 2009-051208 filed with the Japan Patent Office on Mar. 4, 2009, the entire content of which is hereby incorporated by reference.

What is claimed is:

1. A solid-state image pickup element, comprising:
a semiconductor layer having a photodiode, photoelectric conversion being carried out in said photodiode;
a silicon oxide film formed on said semiconductor layer in a region having at least said photodiode by using plasma; and
a film formed on said silicon oxide film and having negative fixed charges.

2. The solid-state image pickup element according to claim 1, wherein a thickness of said silicon oxide film is 3 nm or more.

3. The solid-state image pickup element according to claim 1, wherein said film having the negative fixed charges is made of a material selected from the group having HfO$_2$, ZrO$_2$, Al$_2$O$_3$, TiO$_2$, and Ta$_2$O$_5$.

4. The solid-state image pickup element according to claim 1, wherein a thickness of said silicon oxide film is 2 nm or more.

5. The solid-state image pickup element according to claim 1, wherein a thickness of said silicon oxide film is 1 nm or more.

6. The solid-state image pickup element according to claim 1, wherein said film having the negative fixed charges is made of a material including HfO$_2$.

7. The solid-state image pickup element according to claim 1, wherein said film having the negative fixed charges is made of a material including ZrO$_2$.

8. The solid-state image pickup element according to claim 1, wherein said film having the negative fixed charges is made of a material including Al$_2$O$_3$.

9. The solid-state image pickup element according to claim 1, wherein said film having the negative fixed charges is made of a material including TiO$_2$.

10. The solid-state image pickup element according to claim 1, wherein said film having the negative fixed charges is made of a material including Ta$_2$O$_5$.

11. A method of manufacturing a solid-state image pickup element, comprising the steps of:
forming a photodiode in a semiconductor layer;
forming a silicon oxide film on said semiconductor layer in a region having at least said photodiode by using plasma; and forming a film having negative fixed charges on said silicon oxide film.

12. The method of manufacturing a solid-state image pickup element according to claim 11, wherein in the step of forming said silicon oxide film by using the plasma, said silicon oxide film is deposited so as to have a thickness of 3 nm or more.

13. The method of manufacturing a solid-state image pickup element according to claim 11, wherein a material selected from the group having $HfO_2$, $ZrO_2$, $Al_2O_3$, $TiO_2$, and $Ta_2O_5$ is used as a material for said film having the negative fixed charges.

14. The method of manufacturing a solid-state image pickup element according to claim 11, wherein said film having the negative fixed charges is formed by utilizing any one of an atomic layer deposition method, a metal organic chemical vapor deposition, and a physical vapor deposition.

15. The method of manufacturing a solid-state image pickup element according to claim 11, wherein in the step of forming said silicon oxide film by using the plasma, said silicon oxide film is deposited so as to have a thickness of 2 nm or more.

16. The method of manufacturing a solid-state image pickup element according to claim 11, wherein in the step of forming said silicon oxide film by using the plasma, said silicon oxide film is deposited so as to have a thickness of 1 nm or more.

17. An image pickup apparatus, comprising:
a condensing optical portion for condensing an incident light;
a solid-state image pickup element including
 a semiconductor layer having a photodiode, photoelectric conversion being carried out in said photodiode,
 a silicon oxide film formed on said semiconductor layer in a region having at least said photodiode by using plasma, and
 a film formed on said silicon oxide film and having negative fixed charges,
said solid-state image pickup element serving to receive the incident light condensed by said condensing optical portion, carrying out photoelectric conversion for the incident light; and
a signal processing portion for processing a signal obtained through the photoelectric conversion in said solid-state image pickup element.

18. The image pickup apparatus according to claim 17, wherein a thickness of said silicon oxide film is 2 nm or more.

19. The image pickup apparatus according to claim 17, wherein a thickness of said silicon oxide film is 1 nm or more.

* * * * *